(12) United States Patent
Chiu et al.

(10) Patent No.: US 9,095,059 B2
(45) Date of Patent: Jul. 28, 2015

(54) DISPLAY PANEL INTEGRATING A DRIVING CIRCUIT

(71) Applicant: InnoLux Corporation, Miao-Li County (TW)

(72) Inventors: Chun-Chih Chiu, Miao-Li County (TW); Wei-Chung Lu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/217,692

(22) Filed: Mar. 18, 2014

(65) Prior Publication Data

US 2014/0198462 A1 Jul. 17, 2014

Related U.S. Application Data

(63) Continuation of application No. 14/149,250, filed on Jan. 7, 2014, now Pat. No. 8,836,215, which is a continuation of application No. 12/945,907, filed on Nov. 15, 2010, now Pat. No. 8,659,219.

(51) Int. Cl.
| | |
|---|---|
| *G02F 1/1345* | (2006.01) |
| *H05K 1/02* | (2006.01) |
| *H05K 7/02* | (2006.01) |
| *H05K 1/11* | (2006.01) |
| *G02F 1/1333* | (2006.01) |

(52) U.S. Cl.
CPC .......... *H05K 1/0296* (2013.01); *G02F 1/13452* (2013.01); *H05K 1/0213* (2013.01); *H05K 7/02* (2013.01); *G02F 2001/133388* (2013.01); *H05K 1/11* (2013.01); *H05K 2201/10128* (2013.01)

(58) Field of Classification Search
CPC ..... H05K 1/0296; H05K 7/02; H05K 1/0213; H05K 1/11; H05K 2201/10128; G02F 1/13452; G02F 2001/133388
See application file for complete search history.

(56) References Cited

U.S. PATENT DOCUMENTS

| | | |
|---|---|---|
| 5,499,131 A | 3/1996 | Kim |
| 8,841,839 B2 * | 9/2014 | Chung et al. .................. 313/505 |
| 2007/0109484 A1 * | 5/2007 | Murahashi et al. ........... 349/149 |

* cited by examiner

*Primary Examiner* — Donald Raleigh
(74) *Attorney, Agent, or Firm* — Bacon & Thomas, PLLC

(57) ABSTRACT

A display panel includes a periphery area, an active display area adjacent to the periphery, a driving chip disposed out of the active display area for driving the active display area, and a plurality of wires electrically connecting the driving chip and the active display area. The width of at least one wire at a portion adjacent to the driving chip is smaller than the width of the at least one wire at the other portion adjacent to the active display area.

10 Claims, 5 Drawing Sheets

DISPLAY PANEL INTEGRATING A DRIVING CIRCUIT

BACKGROUND OF THE INVENTION

1. Field of the Invention

The present disclosure generally relates to a display apparatus, and particularly to a display apparatus including a display panel which integrates a driving circuit therein.

2. Description of Related Art

Referring to FIG. 1 and FIG. 2, a display panel 10 includes an active display area 12 and a periphery area 18 adjacent to the active display area 12. A driving chip 14 is disposed in the periphery area for driving electrical elements (not shown) in the active display area 12. A layout area 16 is also defined at the periphery area 18 and between the driving chip 14 and the active display area 12. A plurality of electrical wires 162 in the layout area 16 electrically connect the driving chip 14 and the electrical elements in the active display area 12. Each of the wires 162 has a same width. The layout area 16 may have an approximately trapezoid shape. The layout area 16 may be divided into a plurality of parts along a direction parallel to a boundary 19 between the display area 12 and the periphery area 18. The plurality of parts may include a center part 16a and two side parts 16b at opposite sides of the center part 16a.

However, due to the length of a side of the driving chip 14 where the wires 162 extend from being much shorter than that of the boundary 19 of the active display area 12 where the signal pins are disposed, the lengths of the wires 162 located in the center part 16a are shorter than that of the wires 162 located in the two side parts 16b. That is, the lengths of the wires 162 which are far away from the center part 16a of the layout area 16 are much longer than that of the wires 162 in the center part 16a of the layout area 16. Because the lengths of the wires 162 are different, impedances of the wires 162 are accordingly different. For example, the minimum impedance value of the wire 162 in the most center part 16a may be 0.1Ω, and the maximum impedance value of the wires 162 in the two farthest sides of the two side parts 16b may be 2053.2Ω. Thus the difference of the impedance values can be 2053.1Ω. When the size of the display panel 10 increases, the maximum difference between the impedance values of the wires 162 increases. Therefore, distortion grades of signals according to the impedances of the wires 162 are different from each other after the signals are transferred via the wires 162, and the display quality of the display panel 10 may be seriously deteriorated.

What is needed, therefore, is a display panel thereof which can overcome the described limitations.

SUMMARY OF THE INVENTION

A display panel includes a periphery area, an active display area adjacent to the periphery area and having two opposite sides connecting with the periphery area, a driving chip disposed at the periphery area for driving electrical elements in the active display area, and a plurality of wires electrically connecting the driving chip and the electrical elements in the active display area. The distance from a first part of the wires to the center of the driving chip is farther than the distance from a second part of the wires to the center of the driving chip, and the width of the first part of the wires on a reference line perpendicular to the opposite sides of the active display area is greater than the width of the second part of the wires on the reference line.

Other novel features and advantages will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION OF THE PREFERRED EMBODIMENT

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known components, and circuits have not been described in detail so as not to unnecessarily obscure aspects of the embodiments.

Figure 1:
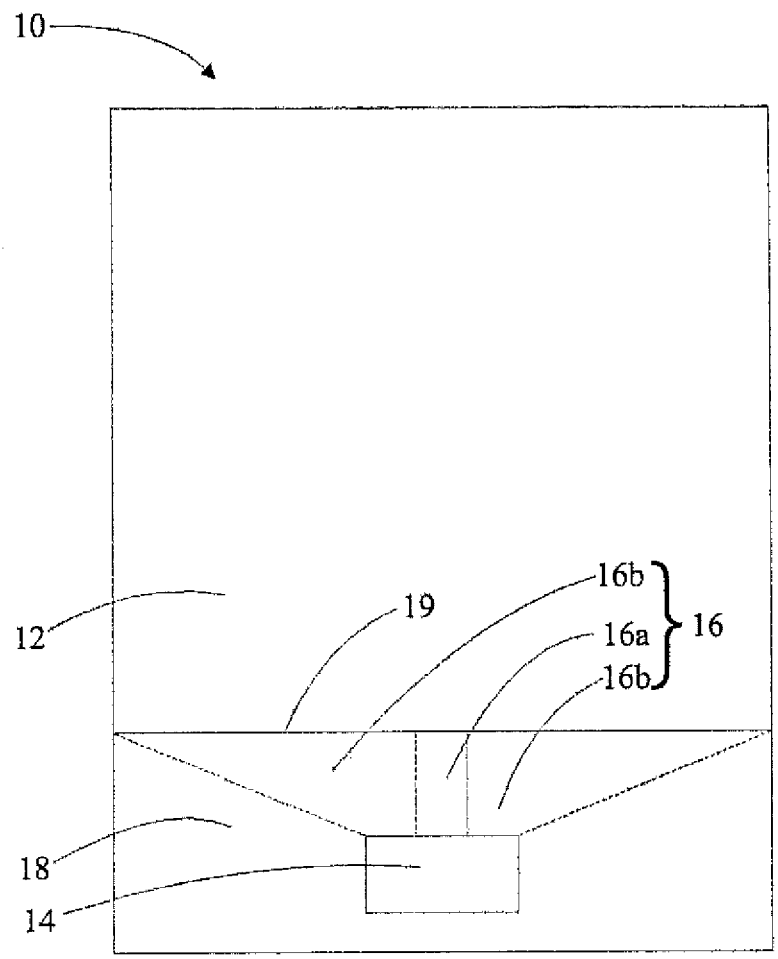
FIG. 1 is a schematic diagram of a typical display panel including a layout area.
Figure 2:
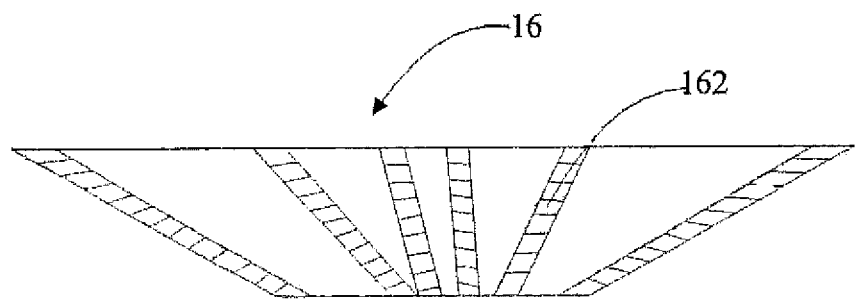
FIG. 2 is an enlarged, schematic diagram of part of the layout area in the display panel of FIG. 1.
Figure 3:
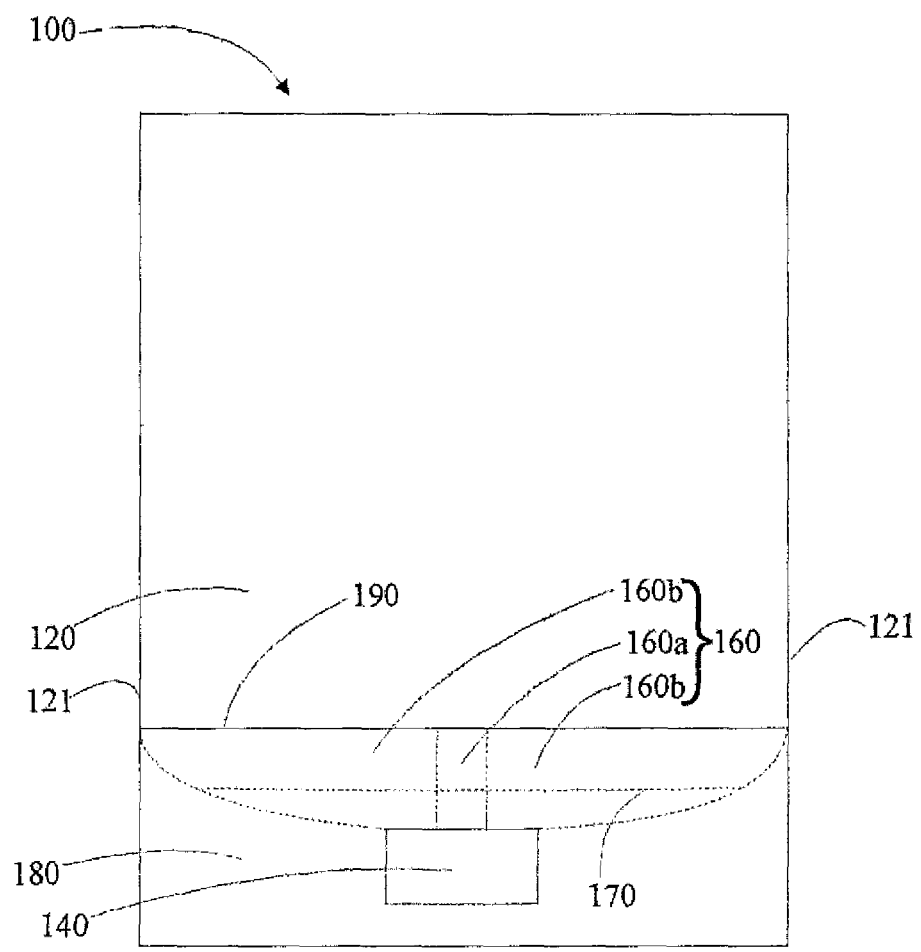
FIG. 3 is a schematic diagram of a display panel according to an embodiment of the present disclosure, the display panel including a layout area.
Figure 4:
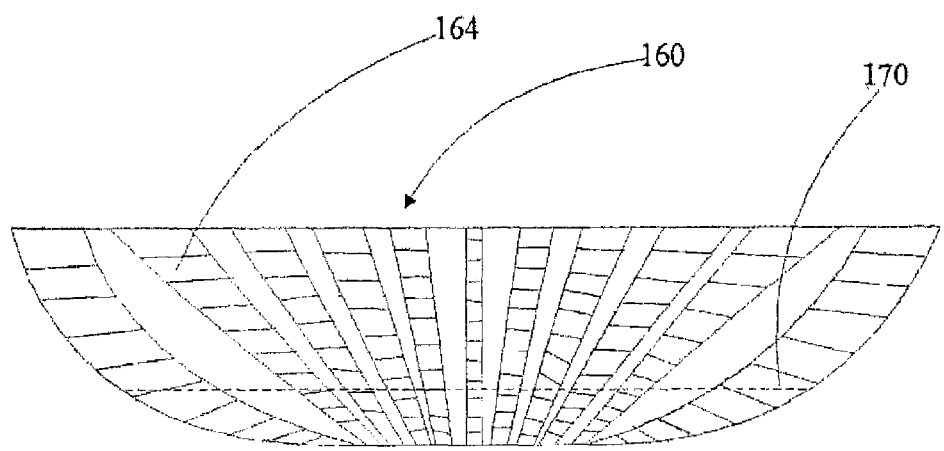
FIG. 4 is an enlarged, schematic diagram of part of the layout area in the display panel of FIG. 3.

Referring to FIG. 3 and FIG. 4, a display panel 100 according to an embodiment of the present disclosure includes an active display area 120 for display and a periphery area 180 adjacent to the active display area 120. The active display area 120 has two opposite sides 121 connecting with the periphery area 180. A driving chip 140 is disposed in the periphery area 180 for driving electrical elements (not shown) in the active display area 120. A layout area 160 is also defined in the periphery area 180 and between the driving chip 140 and the active display area 120. The layout area 160 may have an approximately arc shape design. A plurality of electrical wires 164 formed in the layout area 160 electrically connect the driving chip 140 and the electrical elements in the active display area 120. The layout area 160 may be divided into a plurality of parts along a direction parallel to a boundary 190 between the active display area 120 and the periphery area 180. The plurality of parts may include a center part 160a and two side parts 160b at opposite sides of the center part 160a.

Lengths of the wires 164 are different. Lengths of the wires 164 gradually increase from a center of the center part 160a to farthest edges of the side parts 160b. The lengths of the wires 164 located in the center part 160a are shorter than that of the wires 164 located in the two side parts 160b. In the present disclosure, at least a part of the wires 164 has a various width. For example, the distance from a first part of the wires 164 to the center of the driving chip 140 is farther than the distance from a second part of the wires 164 to the center of the driving chip 140, and the widths of the first part of the wires 164 adjacent to the opposite sides 121 of the active display area 120 and on a reference line 170 perpendicular to the opposite sides 121 are longer than the widths of the other part of the wires 164 adjacent to a center of the driving chip 140 and on the reference line 170. Additionally, the width of at least a part of the wires 164 gradually increase from an end adjacent to the driving chip 140 to the other end adjacent to the active display area 120 and the wires 164 located in the centre part 160a have same width from the end adjacent to the driving chip 140 to the other end adjacent to the active display area 120. Further, widths of the wires 164 are different at positions located at the reference line 170 which is parallel to the boundary. Specifically, the width of each wire on the reference line 170 gradually increase from the center of the driving chip to the opposite sides of the active display area. The length of the wire 164 is greater, the width of the wire 164 at the position is greater. For example, the widths of the wires 164 which are far away from the center part 160a of the layout area 160 are much greater than the widths of the wires 164 located in the center part 160a of the layout area 160. The outermost wires 164 located in the two side parts 160b may have curve edges.

The width of at least a portion of the wires 164 gradually increase from an end adjacent to the driving chip 140 to the other end adjacent to the active display area 120 and the width of the wires 164 on the reference line 170 gradually increase from the center of the driving chip 140 to the opposite sides 121 of the active display area 120. Therefore, the maximum impedance value of the wires 164 in the two farthest sides of the two side parts 160b of the layout area 160 is reduced, and the maximum difference among the impedances of the wires 164 is also reduced. For example, the maximum impedance value of the wires 164 in the two farthest sides of the two side parts 160b of the layout area 160 may be 991.4Ω, and the minimum impedance value of the wire 164 located in the most center part 160a of the layout area 160 may be 7.5Ω, thus the difference of the impedance values can be 983.9Ω. That is, the difference of the impedance value between wires 164 located in the two side parts 160b of the layout area 160 and the impedance value of wires 164 located in the center part 160a of the layout area 160 can be reduced.

In this embodiment of the present disclosure, the difference of the impedance values between the wires 164 caused by different lengths of the wires can be reduced. The maximum difference between impedance values of the wires 164 is also significantly reduced. Therefore, the distortion grades of signals according to the impedance of the wires 164 are reduced, and the display quality of the display panel 100 may be greatly improved.

Figure 5:
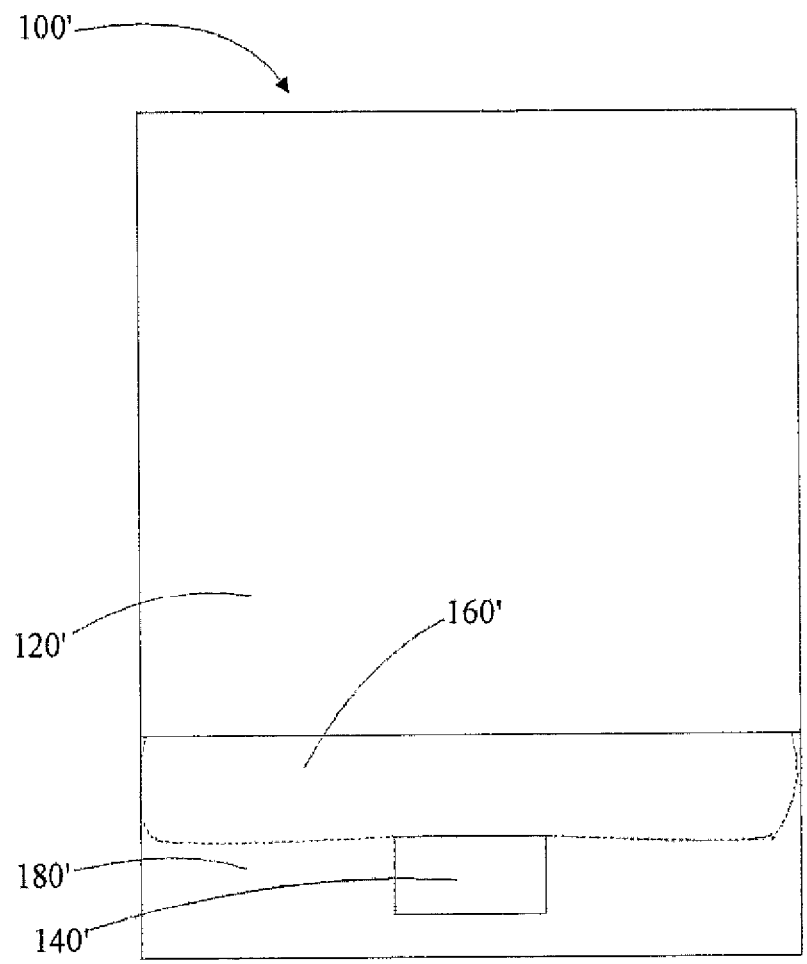
FIG. 5 is a schematic diagram of a display panel according to another embodiment of the present disclosure, the display panel including a layout area.

In another alternative embodiment of the present disclosure, referring to FIG. 5, a display panel 100' is similar to the display panel 100, and the differences are described as below. The layout area 160' may have an approximately rectangular shape. A plurality of wires is formed in the layout area 160'. The area of the layout area 160' is larger than that of the layout area 160, and the widths of the wires in the layout area 160' is much greater than the widths of the wires of the layout area 160. The width of each wire from a first end connecting with the driving chip to a second end connecting with the display area in the two side parts is much greater. Therefore, the difference of the impedance value of wires located in the two side parts of the layout area 160' and the impedance value of wires located in the center part of the layout area 160' can also be reduced.

It is believed that the present embodiments and their advantages will be understood from the foregoing description, and it will be apparent that various changes may be made thereto without departing from the spirit and scope of the embodiments or sacrificing all of their material advantages.

What is claimed is:

1. A display panel, comprising:
   a periphery area;
   an active display area adjacent to the periphery area;
   a driving chip disposed out of the active display area for driving the active display area; and
   a plurality of wires electrically connecting the driving chip and the active display area;
   wherein at least one first wire of the plurality of wires has a first side with a first curvature radius and a second side with a second curvature radius different from the first curvature radius, and the as least one first wire is disposed in the periphery area.

2. The display panel of claim 1, wherein the active display area has two opposite sides connected with the periphery area, wherein the distance from a first part of the wires to the center of the driving chip is farther than the distance from a second part of the wires to the center of the driving chip, and the width of the first part of the wires on a reference line perpendicular to the opposite sides of the active display area is greater than the width of the second part of the wires on the reference line, and wherein the widths of wires on the reference line gradually increase from the center of the driving chip to the opposite sides of the active display area.

3. The display panel of claim 1, wherein the width of some of the wires gradually increases from an end adjacent to the driving chip to the other end adjacent to the active display area.

4. The display panel of claim 1, wherein the periphery area further comprises a layout area between the driving chip and the active display area, and the wires are disposed in the layout area.

5. The display panel of claim 4, wherein the layout area has an approximately arc shape design.

6. The display panel of claim 4, wherein the layout area comprises a center part and two side parts at opposite sides of the center part.

7. The display panel of claim 6, wherein the wires located in the two side parts has curve edges.

8. The display panel of claim 6, wherein the active display area has two opposite sides connected with the periphery area, wherein the distance from a first part of the wires to the center of the driving chip is farther than the distance from a second part of the wires to the center of the driving chip, and the width of the first part of the wires on a reference line perpendicular to the opposite sides of the active display area is greater than the width of the second part of the wires on the reference line, and wherein the widths of the wires located in the two side part and on the reference line are greater than the widths of the wires located in the center parts and on the reference line.

9. The display panel of claim 6, wherein the wires located in the center part have same width from an end adjacent to the driving chip to the other end adjacent to the active display area.

10. The display panel of claim 4, wherein the layout area has an approximately rectangular shape.

* * * * *